United States Patent [19]

Kupriyanov et al.

[11] 4,164,030

[45] Aug. 7, 1979

[54] FILM CRYOTRON

[76] Inventors: Mikhail J. Kupriyanov, ulitsa Khlobystova, 10, korpus 2, kv. 30; Gennady M. Lapir, korpus 851, kv. 69; Konstantin K. Likharev, Leninsky prospekt, 93, kv. 200; Vasily K. Semenov, korpus 337, kv. 4; Petr E. Kandyba, korpus 438, kv. 11, all of Moscow, U.S.S.R.

[21] Appl. No.: 828,766

[22] Filed: Aug. 29, 1977

[30] Foreign Application Priority Data

Sep. 9, 1976 [SU] U.S.S.R. ................................ 2392651
Apr. 18, 1977 [SU] U.S.S.R. ................................ 2468099

[51] Int. Cl.² .............................................. G11C 11/44
[52] U.S. Cl. ..................................... 365/162; 307/277
[58] Field of Search ............... 365/162; 307/277, 306

[56] References Cited

U.S. PATENT DOCUMENTS

| | | | |
|---|---|---|---|
| 3,643,237 | 2/1972 | Anacker | 365/162 |
| 3,705,393 | 12/1972 | Anacker et al. | 365/162 |
| 3,879,715 | 4/1975 | Zappe | 365/162 |
| 3,936,809 | 2/1976 | Zappe | 365/162 |

*Primary Examiner*—Terrell W. Fears
*Attorney, Agent, or Firm*—Lackenbach, Lilling & Siegel

[57] ABSTRACT

Disclosure is made of a film cryotron comprising a super-conductive ground plane and two superconductive electrodes arranged on said ground plane. The ground plane and electrodes are all insulated from one another. The electrodes are interconnected by an elongated distributed Josephson junction and have input lines and a control line arranged along the Josephson junction and above one of the electrodes. The electrode under the control line is shaped as a strip extending along the Josephson junction. The input line is connected to this electrode at a point spaced from the points at which the control line intersects the boundaries of this electrode and from the ends of the junction at a distance which is greater than the width of said electrode and the depth of the magnetic field penetration into the junction. At the point of connection to the electrode, the input line has a width which is less than that of the electrode.

4 Claims, 9 Drawing Figures

FILM CRYOTRON

FIELD OF THE INVENTION

The present invention relates to superconductive micro-electronic devices for digital computers and, more particularly, to film cryotrons based on the Josephson effect.

DESCRIPTION OF THE PRIOR ART

There is known a film cryotron incorporating a Josephson junction. It is a superconductive switcing device, wherein the critical current of the Josephson junction is controlled by a magnetic field acting on the junction.

A cryotron of the foregoing type comprises a superconductive ground plane and two superconductive film electrodes. The ground plane and electrodes are electrically insulated from one another. The electrodes have input lines and are connected by a univariately distributed Josephson junction (for example, a tunneling junction). The cryotron also includes at least one control line extending along the Josephson junction, above one of said electrodes. One of the dimensions of the univariately distributed Josephson junction is much grater than the depth of penetration of the magnetic field into said junction. The other dimensions of the Josephson junction are either commensurable with or less than that value (the depth).

The superconductive film input lines of the electrodes are a continuation of the electrodes, through which the cryotron is connected to an external circuit. Each electrode has an input line. At the point of connection to the electrode, said input line has a width comparable with the length of the respective side of the electrode.

Such cryotrons are brought from their superconducting state to a resistive state by passing a current $I_c$ through the control line, the current $I_c$ producing a magnetic field reducing the critical current $I_m$ of the Josephson junction.

In the known types of cryotrons, the current amplification factor G normally is not greater than 2, which is insufficient for a number of applications. ($G = I_{mo}/I_{co}$, where $I_{mo}$ is the maximum critical current of the junction, and $I_{co}$ is the minimum current through the control line sufficient to bring the cryotron to a state at which the critical current $I_m$ is reduced to a small value $I_o$ equal to the permissible value of residual current in the non-conducting state of the cryotron).

Besides, the control characteristic $I_n = f(I_c)$ of the known types of cryotrons does not ensure reliable operation of cryotrons incorporated in known logical units and storages; this applies to crossed-film phase junction cryotrons incorporated, for example, in two-line cryotron logic circuits.

This is due to the fact that the curve $I_m = f(I_c)$ differs strongly from the more desirable rectangular shape. The curve $I_m = f(I_c)$ is quite steep close to $I_c = 0$.

The reason for it is that in the known types of cryotrons the magnetic field of the current $I_c$ in the control line induces currents in the Josephson junction which pass through that contact at the same points as the supply current from the external circit. As a result, even at low values of the current $I_c$, the current induced in the junction is added at some point of the junction to the supply current, whereby the critical current is changed by a value which is approximately equal to the value of the induced current.

SUMMARY OF THE INVENTION

It is a main object of the present invention to provide a film cryotron based on a distributed Josephson junction, having a control characteristic of a more convex shape, so that the steepness of the curve $I_m = f(I_c)$ is close to zero at small values of the current $f_c$ in the control line.

It is another object of the invention to provide a cryotron with a control characteristic close to the rectangular shape, so that the steepness of the curve $I_m = f(I_c)$ is small at $I_c < I_{co}$ and great at $I_c \simeq I_{co}$.

It is still another object of the invention to ensure a high current amplification factor, while maintaining a convex shape of the control characteristic curve.

The objects of the present invention are attained by providing a film cryotron comprising a superconductive ground plate and two superconductive electrodes arranged on said ground plate, the ground plate and electrodes being mutually insulated from one another. The electrodes are connected by an elongated distributed Josephson junction and have input lines and at least one control line extending along the Josephson junction and being above one of the electrodes. The electrode which is under the control line is shaped, according to the invention, as a strip extending along the Josephson junction. The input line is connected to this electrode at a point spaced from the points at which the control line intersects the boundaries of this electrode and from the ends of the junction at a distance which is greater than the width of this electrode and the depth of penetration of the magnetic field into the junction.

In order to impart a more convex shape to the control characteristic curve of the cryotron, it is preferable that at the point of connection to the strip-shaped electrode the input line should have a width less than the width of that electrode.

In order to increase the current amplification factor G of the cryotron it is preferable that it should be provided with at least one more input line connected to the strip-shaped electrode, which input line should be similar to the first input line and placed in parallel with it.

In order to further increase the steepness of the control characteristic curve of the cryotron and make its shape close to that of a rectangular, it is preferable that the strip-shaped electrode should have wider portions between the points at which the control line intersects the boundaries of this electrode and the point of connection of the input line, the length of the wider portions being no less than the depth of penetration of the magnetic field into the junction and the width of the electrode strip.

The basic advantage of the proposed cryotron is that the control characteristic curve is convex and has a shape close to that of a rectangular. Another advantage is the possibility of providing a practically unlimited current amplification factor, while maintaining the convex shape of the control characteristic curve.

BRIEF DESCRIPTION OF THE DRAWINGS

Other objects and advantages of the present invention will be more fully understood from the following detailed description of preferred embodiments thereof to be read in conjunction with the accompanying drawings, wherein.

DETAILED DESCRIPTION OF THE INVENTION

Figure 1:
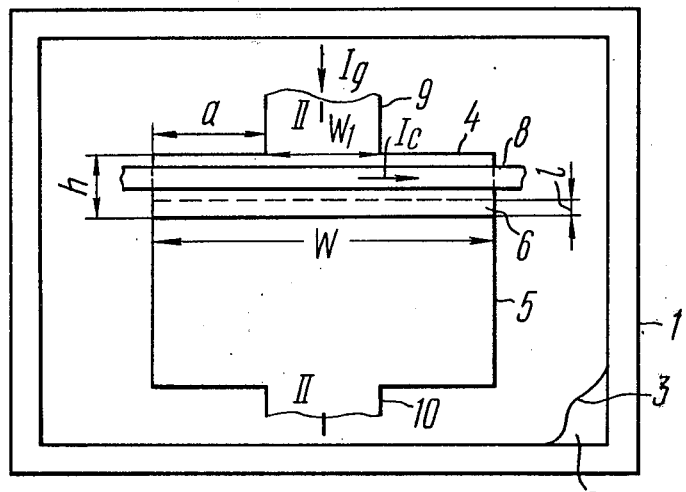
FIG. 1 is a plan view of a film cryotron comprising an elongated distributed Josephson junction, in accordance with the invention.
Figure 2:
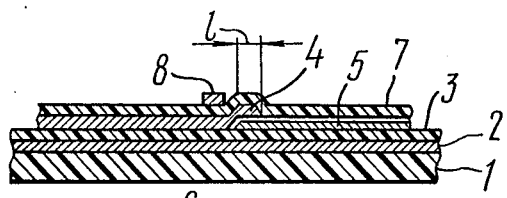
FIG. 2 is a sectional view taken on line II—II of FIG. 1.

The film cryotron, shown in FIGS. 1 and 2, comprises an insulating substrate 1 onto which is applied a superconductive ground plane 2. Insulated from the ground plane 2 by a dielectric layer 3 are superconductive film electrodes 4 and 5 connected by an elongated distributed Josephson junction 6 having a width l and a length w. The electrode 4 is shaped as a strip extending along the junction 6. Insulated from it by a dielectric layer 7 and extending above said electrode 4 is a control line 8. (The dielectric layer 7 is not shown in FIG. 1.) For connection to an external circuit the electrodes 4 and 5 have input lines 9 and 10, respectively. The lines 9 and 10 are of superconductive films. The input line 9 has a width $w_1$ and is connected to the electrode 4 at a portion adjacent to the middle of the junction 6. This portion is spaced from the ends of the junction 6 and from the points at which the control line 8 intersects the boundaries of the electrode 4 by a distance "a" which is greater than the depth $\lambda_J$ of penetration of the magnetic field into the junction 6 and the width h of the strip of the electrode 4. To meet this condition, the distance "a" from the ends of the strip 4 to the points of connection of the input line 9 must be: $a > \lambda_m$, where $\lambda_m = \max(\lambda_J, h)$.

The function of the elongated distributed Josephson junction 6 can be performed by any known type of such contacts, for example, a tunneling junction (as shown in FIG. 2) with a barrier layer of an insulator or semiconductor. In such a case, when viewed from above, the length w of the Josephson contact 6 is much greater than $\lambda_J$ (for example, $w \approx 10\lambda_J$), whereas the width l is in the order of $\lambda_J$. In the zone of the contact 6, one of the electrodes (in the embodiment under review, the electrode 4) is above the other (the electrode 5).

The arrangement of the control line 8 above the electrode 4 can be selected arbitrarily, although it is absolutely necessary to meet the foregoing condition with regard to the spacing beween thepoints of intersection of said control line 8 with the boundaries of the electrode 4 and the point at which the line 9 is connected to the electrode 4. The elongated distributed Josephson junction 6 and the strip of the electrode 4 extending along said junction 6 need not necessarily be quadrangles, as far as their shape is concerned; for example, said electrode 4 and junction 6 can be bent in the plane of the substrate 1.

Figure 3:
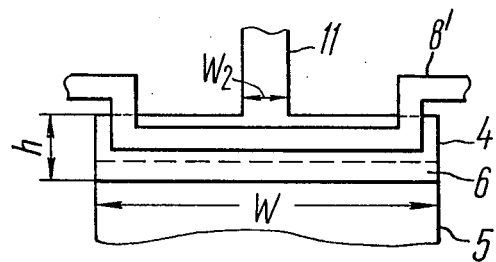
FIG. 3 is a plan view of a cryotron with a narrow input line.

Unlike the embodiment of FIG. 1, the cryotron shown in FIG. 3 has a narrower input line 11 whose width $w_2$ at the portion where said line 11 is connected to the electrode 4 is not greater than the width h of said electrode 4. The control line 8' is bent.

For greater simplicity, FIG. 3 and other drawings do not show the substrate 1, the ground plane 2 and the layers 3 and 7.

Figure 4:
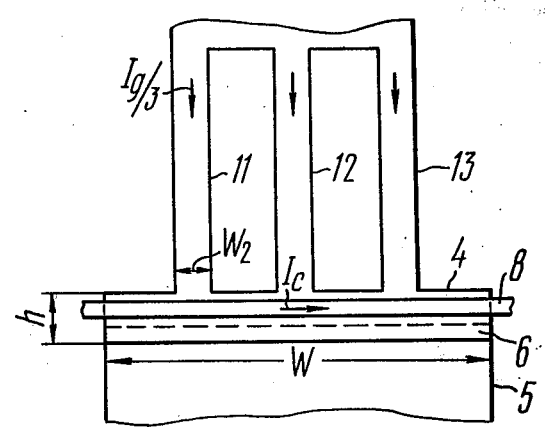
FIG. 4 is a plan view of a cryotron with a plurality of input lines connected to one of the electrodes, in accordance with the invention.

Unlike the embodiment of FIG. 3, the cryotron shown in FIG. 4 has two input lines 12 and 13, which are similar to the line 11 placed in parallel with said line 11.

The width $w_2$ of the lines 11, 12 and 13 and the spacing between the points at which they are connected to the electrode 4 and their common point of connection are selected so that the inductance of each of the lines 11, 12 and 13 should be sufficiently grat, or at least comparable with the inductance of the strip of the electrode 4; "a" and h are selected so as to meet the foregoing condition as regards the spacing between the points of connection of said lines 11, 12 and 13 and the points at which the control line 8 intersects the boundaries of the electrode 4. At the point of connection to the electrode 4, the width $w_2$ of each of the lines 11, 12 and 13 is selected to be less than h.

Figure 5:
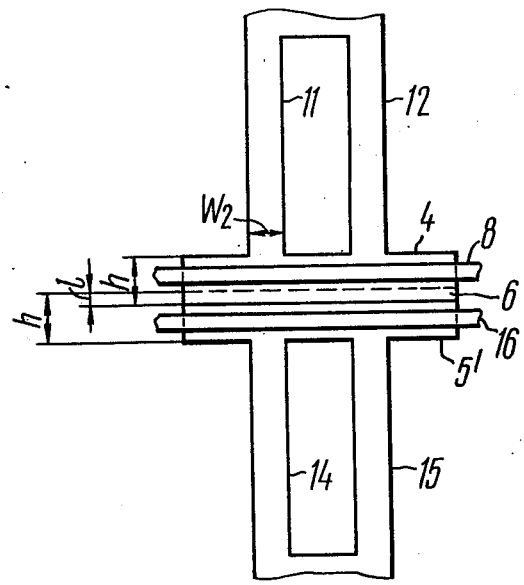
FIG. 5 is a plan view of a cryotron with a plurality of parallel input lines and two control lines, in accordance with the invention.

The embodiment of FIG. 5 is similar to that of FIG. 4. The cryotron of FIG. 5 has two control lines, 8 and 16. The electrodes 4 and 5' are strips extending along the contact 6.

In this case the cryotron is symmetrical: the input lines 11 and 12 are connected to the electrode 4 and the input lines 14 and 15 are connected to the electrode 5'.

It is also possible to arrange both control lines 8 and 16 above one of the electrodes 4 and 5', for example, above the electrode 4, although this necessitates an increase in the width h of the electrode 4 and, consequently, an increase in the overall dimensions of the cryotron.

Figure 6:
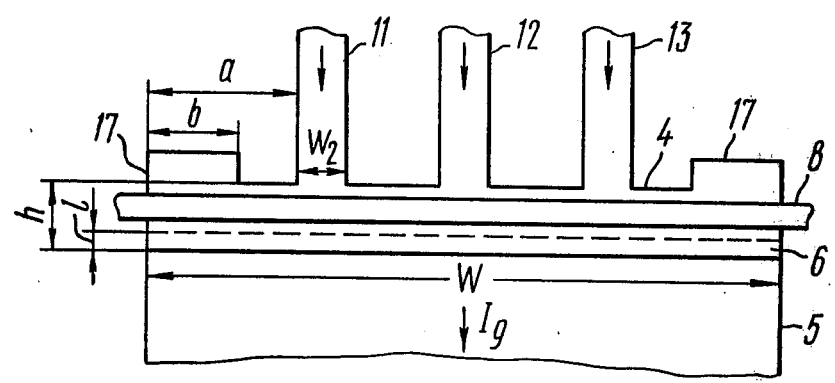
FIG. 6 is a plan view of a film cryotron with widening portions, in accordance with the invention.

Unlike the embodiment of FIG. 4, in the cryotron shown in FIG. 6, the electrode 4 has widening portions 17 between the points at which the control line 8 intersects the boundaries of said electrode 4 and the points at which the input lines 11 and 13 are connected to said electrode 4. The distance "a", the width h and the length b of the portions 17 are selected so as to meet the above requirement as regards the spacing between the points at which the control line 8 intersects the boundaries of the electrode 4 and the input lines 11, 12 and 13; besides, it is necessary that $b \simeq \lambda_m$.

Figure 7:
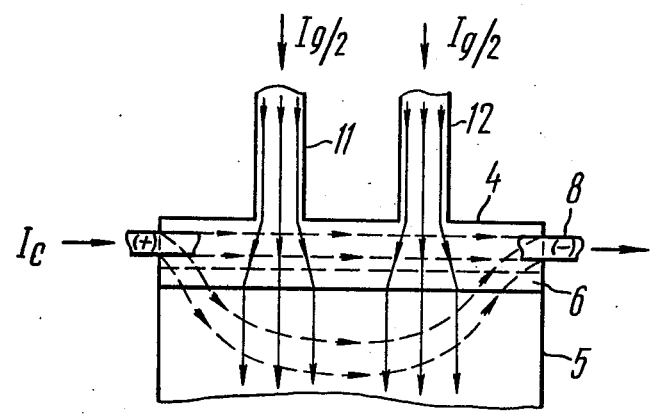
FIG. 7 is a current distribution diagram of a cryotron in accordance with the invention.

FIG. 7 is a representation of current distribution in the electrodes of a cryotron with two input lines 11 and 12. The solid lines with arrows show the distribution of the supply transport current $I_g$ flowing from the external circuit from the electrode 4 to the electrode 5 over the surfaces of the electrodes 4 an 5 which faces the superconductive ground plane (not shown in FIG. 7). The dash lines with arrows show the distribution of currents induced on said surfaces of the electrodes 4 and 5 by passing the control current $I_c$ through the control line 8.

The distribution of the currents $I_g$ and $I_c$ is always the same irrespective of the number of input lines, although a change in the number of input lines changes the value of the current $I_g$ passing through each input line.

Figure 8:
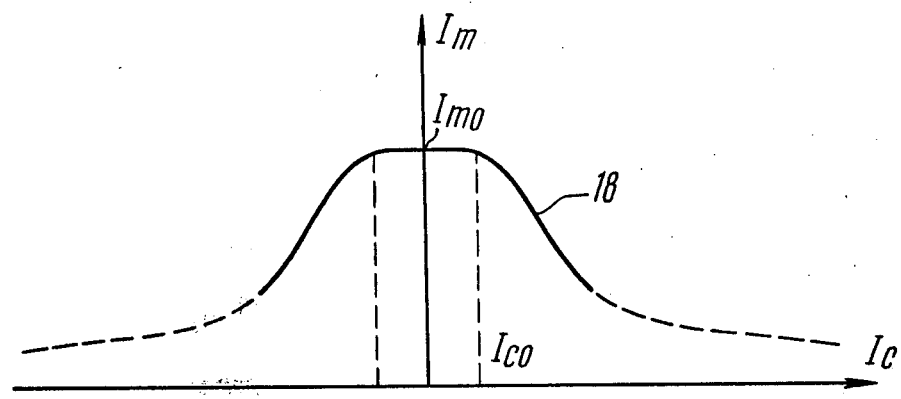
FIG. 8 is a control characteristic curve of the cryotron of FIG. 1.

In FIG. 8, the curve 18 represents the relationship between the critical current $I_m$ (plotted along the y-axis)

of the cryotron of FIG. 1 and the control current $I_c$ in the line 8 (plotted on the x-axis). The value $I_{co}$ corresponds to a value of the control current $I_c$ at which the critical current $I_m$ starts to decrease, as compared to its maximum value $I_{mo}$, due to fluxoids induced in the Josephson contact.

The dash lines show portions of the curve 18, which are envelopes of the maxima of the exact relationships $I_m = f(I_c)$ at values of $I_c$ which may bring oscillations ("side lobes") into these relationships.

Figure 9:
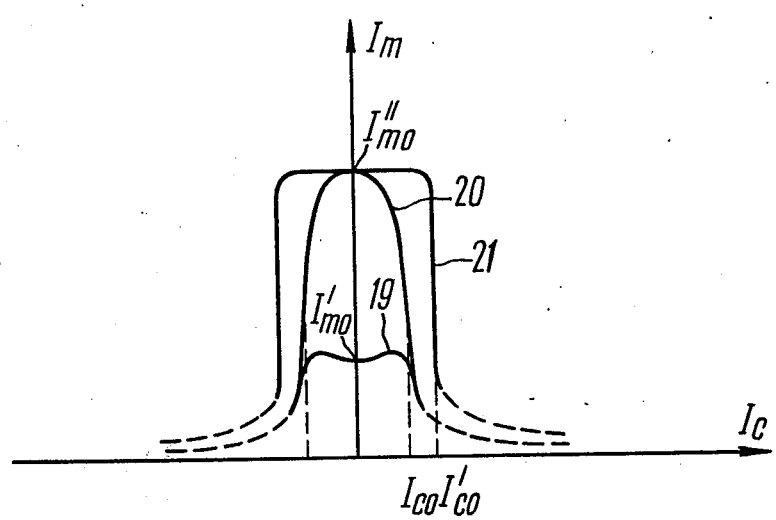
FIG. 9 shows control characteristic curves of the cryotrons of FIGS. 3, 4 and 6.

In FIG. 9, the curves 19, 20 and 21 are control characteristic curves for the cryotrons of FIGS. 3, 4 and 6, respectively. $I_m$, $I_c$, $I_{co}$ and the dash portions of the curves 19, 20 and 21 are as in FIG. 8.

$I_{co}$, for the curve 21 is as $I_{co}$ for the curves 19 and 20.

The maximum critical current $I_{mo}''$ for cryotrons with a plurality of input lines (the curves 20 and 21) is n times greater than the value of the critical current $I_{mo}$, for a cryotron with a single narrow line (the curve 19), where n is the number of input lines.

The value of the control current $I_{co}$, at which the critical current $I_m$ starts to decrease, is somewhat greater in the case of a cryotron with widening portions of the electrode (the curve 21) than in the case of a similar cryotron without any widening portions of the electrode (the curve 20). Close to the point $I_c = I_{co}$, the steepness of the curve 21 is greater than that of the curve 20 near the point $I_c = I_{co}$, which shows that the curve 21 is closer to the rectangular shape than the curve 20.

The proposed film cryotron operates as follows.

In the absence of the current $I_c$ in the control line 8 (FIGS. 1 and 2), the superconductive transport current $I_g$, which is not higher than the value of the critical current $I_{mo}$ (FIG. 8), may pass through the junction 6 of the cryotron. The current passing through the input line 9 (FIG. 1) somewhat spreads about the electrode 4 and passes through the Josephson junction 6 at a portion next to the input line 9, which extends along the junction 6 over a distance which is greater than the width $w_1$ of said line. The spreading of the current $I_g$ is: $\lambda_m = \max(\lambda_j, h)$. The input line 9 is spaced from the ends of the junction 6 at a distance which is greater $\lambda_m$; as a result, the transport current $I_g$ does not reach the portions of the junction 6 which are next to said ends.

As the current $I_c$ is passed through the control line 8, it induces currents in the strip of the electrode 4, which is under said control line 8, as well as on the surfaces of the Josephson junction 6 and the electrode 5, which face the super conductive ground plane 2. These currents are shown by the dash lines with arrows in FIG. 7. The currents induced on said surfaces are distributed as would be distributed currents in this film structure unless the line 8 were insulated, but instead would be galvanically coupled to the electrode 4 under it (the points at which the current $I_c$ enters and leaves the electrode at the intersections between the boundaries of said electrode and the control line 8 are designated as (+) and (−), respectively, in FIG. 7). Part of the induced current flows from the electrode 4 under the control line 8 to the adjacent electrode 5 via portions of the Josephson junction 6 having linear dimensions on the order of $\lambda_m$ and located next to said points at which the control line 8 intersects with the boundaries of the electrode 4.

The portion of the current flowing through the electrode 5 is determined by the ratio between the inductances of the two possible current paths, i.e. through the electrode 4 and through the electrode 5. Before the current induced in the junction 6 reaches a critical value, it is localized close to the ends of the junction 6 and has but little effect on the current $I_m$, because the transport current flows through the middle of the contact 6. As the current $I_c$ in the line 8 increases and reaches the value $I_{co}$, the value of the induced current, which flows through the junction 6 near its ends, reaches the critical value $2 \lambda_m \cdot j_c$, where $j_c$ is the linear critical current density of the Josephson junction 6. If the current $I_c$ is in excess of the above-mentioned value, fluxoids start to move towards the middle of the junction 6 (these are circular currents which cover a portion of the junction 6 with a magnetic flux on the order of a quantum of the flux $\Phi_o = 2.10^{-7}$ g.cm$^2$). In the junction 6 there is produced a vortex structure state in which in all the portions of said junction 6 there is induced a current of some polarity. The critical current $I_m$ starts to decrease, as shown in FIG. 8 (the curve 18), because the flow of the transport current through the junction (FIG. 1) with the vortex structure forces this structure to move along the junction 6; as a result, there appears a voltage between the electrodes 4 and 5. Thus the control characteristic curve $I_m = f(I_c)$ (FIG. 8) becomes convex in shape.

In the cryotron of FIG. 1, wherein at the point of connection to the electrode 4 the input line 9 is wider than h, the control characteristic curve (the curve 18 of FIG. 8) is convex, but has relatively flat drooping portions at $/I_c/ > I_{co}$. This is due to the fact that the vortex current structure, which appears at $/I_c/ = I_{co}$ close to the edges of the junction 6, cannot immediately reach the middle of said junction 6 because of potential barriers which are produced on the boundaries of the portion at which the wide line 9 is connected to the strip of the electrode 4, where the inductance of said strip is reduced. The potential barriers impede the movement of the fluxoids towards the middle of the junction 6. As a result, there is not an instantaneous drop in the critical current $I_m$ (FIG. 8) due to the increase in $I_c$, and the control characteristic curve has a shape which differs from that of a rectangular.

The cryotron of FIG. 3 makes it possible to produce a control characteristic whose curve is closer to the rectangular. This cryotron operates as does the one shown in FIGS. 1 and 2, however, the smaller width $w_2$ of the input line 11 accounts for a reduced counter-action with regard to the movement of fluxoids from the ends to the middle of the junction 6.

It must be pointed out in this connection that a reduced width of the input line 11 accounts for a reduced current amplification faction G, because the amplification factor is proportional to the ratio between the length of that portion of the junction 6, through which there flows the transport current (this is determined by the width of the input line) and the length $(2\lambda_m)$, of that portion at the end of the junction 6, through which there passes the induced current at $/I_c/ < I_{co}$. Keeping in mind that $I_{mo} \leq 4\lambda_m j_c$ and $I_{co}2 > 2j_c \cdot \lambda_m$, it is clear that the cryotron of FIG. 3 cannot account for a current amplification factor G of more than two. The cryotron of FIG. 4 makes it possible to produce a sufficiently high current amplification factor G. while maintaining a shape of the control characteristic curve close to that of a rectangular, as is the case with the cryotron of FIG. 3. In this case, the current $I_g$ flows from the external circuit through the input lines 11, 12 and 13 and is distributed among these lines in inverse proportion to their inductances. When there are equal dimensions of said lines 11, 12 and 13, the current distribution is equal. Each of the lines 11, 12 and 13 is quite narrow, and they are all quite far from the points at which the boundaries of the electrode 4 are intersected by the control line 8, so the cryotron of FIG. 4 operates in a manner similar to that of the cryotron of FIG. 3. However, the presence of a plurality of input lines 11, 12 and 13 makes it possible to increase the maximum critical current and increase the current amplification factor of the cryotron, while maintaining a shape of the control characteristic curve, which is close to that of a rectangular (the curve 20 of FIG. 9).

In the cryotron under review, the distances between the points at which the input lines 11, 12 and 13 are connected to the electrode 4 can be selected arbitrarily. With a certain fixed number of input lines, the greatest gain in the current amplification factor G is ensured when the spacing between said input lines is not less than $4\lambda_m$. On the contrary, with a fixed width w of the junction 6, the current amplification factor G is the greatest when said spacing is less than $\lambda_m$, if the number of lines is sufficiently large. For example, in order to ensure a current amplification factor close to four, which is enough for most applications, it is necessary that $w \geq 8\lambda_m$, and $=2$, and the apacing between the points of connection of the lines must at least $4\lambda_m$.

FIG. 5 shows an embodiment of a cryotron with two control lines 8 and 16. This cryotron operates as does the one of FIG. 4, but has greater functional potentialities. However, with an equal number and arrangement of input lines similar to those of the cryotron of FIG. 4, the current amplification factor of the cryotron of FIG. 5 is only about one half of that of the cryotron shown in FIG. 4. This is due to the fact that only part of the current induced by the control line 8 or 16 in the respective electrode 4 or 5 flows to the adjacent electrode (with equal inductances of the electrode 4 or 5, about one half of that current flows to the adjacent electrode). As a result, the current $I_{co}$, which is necessary to produce fluxoids, increases about two-fold, as compared to the embodiment of FIG. 4, where the inductance of the electrode 4 is much greater than that of the electrode 5, so that almost all the induced current flows from the electrode 4 to the electrode 5.

Hence, in order to have a current amplification factor close to four, w and h must be selected to be two times greater than the respective values in the foregoing embodiment.

The cryotron of FIG. 6 operates in a manner similar to that of the cryotron of FIG. 4. However, the presence of the widening protions 17 accounts for a more rapid decrease in the current $I_m$ after the current $I_c$ reaches the value $I_{co}$, (the curve 21 of FIG. 9), at which a vortex current structure is produced at the ends of the junction 6 (FIG. 6). The presence of the widening portions 17 at the ends of the electrode 4 causes and determines the local decrease in its inductance and thus builds up a potential barrier for fluxoids arriving from the ends of the junction 6. Thus, a somewhat greater current must be induced at the ends of the junction 6 to produce a vortex state. This, in turn, accordingly reduces the current amplification factor G, as compared to the embodiments without said widening portions 17. Yet after the induced current reaches the critical value, the vortex structure starts moving from the ends to the middle of the junction 6 more easily, because the energy of the fluxoids is reduced after they pass through the widening portions 17 and reach the narrow portions of the strip of the electrode 4, where the inductance is greater. It could be said that in this case the fluxoides appear as if they were "rolling" towards the middle of the junction 6. As a result, the critical current $I_m$ is reduced within a narrower interval of the increase in the current $I_c$, which ensures a control characteristic curve which is closest to that of a rectangular shape.

What is claimed is:

1. A film cryotron comprising: a superconductive ground plane; a first superconductive electrode arranged on said ground plane and insulated therefrom; a second superconductive electrode arranged on said ground plane and insulated therefrom; an elongated distributed Josephson junction interconnecting said electrodes; as least the first electrode being shaped as a strip extending along the Josephson junction; a control line extending along the Josephson junction above said first electrode; an input line connected to said second electrode; an input line connected to said first electrode at a portion which is spaced from the points of intersection between said control line and the boundaries of said first electrode and from the ends of said junction by a distance which is greater than the width of said first electrode and the depth of penetration of the magnetic field into said junction, said input line having a width which is less than the width of said first electrode.

2. A film cryotron as claimed in claim 1, further comprising at least one more input line connected to said first electrode, which is similar to said input line connected to said first electtode and placed in parallel with it.

3. A film cryotron as claimed in claim 1, wherein said first electrode has widening portions between the points at which said control intersects the boundaries of said first electrode and the point of connection of said input line to said first electrode the size of said widening portions along said first electrode being not less than the depth of penetration of the magnetic field into said junction and the width of said first electrode.

4. A film cryotron as claimed in claim 2, wherein said first electrode has widening portions between the points at which said control line intersects the boundaries of said first electrode and the point of connection of said input line to said first, the size of said widening portions along said first electrode being not less than the depth of penetration of the magnetic field into said junction and the width of said first electrode.

* * * * *